US005504450A

United States Patent [19]
McPartland

[11] Patent Number: 5,504,450
[45] Date of Patent: Apr. 2, 1996

[54] HIGH VOLTAGE COMPONENTS FOR EEPROM SYSTEM

[75] Inventor: Richard J. McPartland, Nazareth, Pa.

[73] Assignee: AT&T Corp., Murray Hill, N.J.

[21] Appl. No.: 163,958

[22] Filed: Dec. 8, 1993

[51] Int. Cl.$^6$ .......................... H03K 17/687; H03K 5/08
[52] U.S. Cl. ........................ 327/437; 327/328; 327/333; 327/391; 327/434
[58] Field of Search ................................. 307/475, 571, 307/572, 573, 575, 576, 577, 579, 581, 584, 585; 326/63, 68, 80; 327/387, 389, 391, 427, 434, 436, 437, 328, 333

[56] References Cited

U.S. PATENT DOCUMENTS

| | | | |
|---|---|---|---|
| 4,721,866 | 1/1988 | Chi et al. | 307/585 |
| 4,933,579 | 6/1990 | Isobe et al. | 327/437 |
| 4,996,446 | 2/1991 | Nakada | 327/427 |
| 5,029,283 | 7/1991 | Ellworth et al. | 307/296.8 |
| 5,077,518 | 12/1991 | Han | 307/296.8 |
| 5,128,560 | 7/1992 | Chern et al. | 307/475 |
| 5,278,460 | 1/1994 | Casper | 307/296.8 |

*Primary Examiner*—Terry Cunningham

[57] ABSTRACT

A high voltage circuit for an electronic erasable programmable read only memory (EEPROM) integrated circuit (IC) is implemented using lower voltage semiconductor components. In the preferred embodiment, the circuit is capable of switching a twenty-four volt signal using p-channel metal-oxide semiconductor field effect transistors (MOSFETs) with a rated breakdown voltage not exceeding twelve volts. In the preferred embodiment, the circuit switches a driver signal in response to a first control signal. The circuit includes a first switch, connected between ground and an output, for selectively connecting the output to ground in response to the first control signal; a second switch, connected between the driver signal and the output for selectively connecting the driver signal to the output in response to a second control signal; a third switch for receiving the driver signal and the first control signal and for generating the second control signal, where the third switch includes a plurality of transistors and the driver signal is distributed across the plurality of transistors so that the driver signal is not across any single transistor; and a voltage divider circuit for dividing the driver signal into a plurality of lower voltage signals for controlling the third switch, wherein a magnitude of at least one of the lower voltage signals is controlled by the first control signal.

10 Claims, 9 Drawing Sheets

HIGH VOLTAGE COMPONENTS FOR EEPROM SYSTEM

BACKGROUND OF THE INVENTION

1. Field of the Invention

The present invention relates generally to high voltage circuits. More specifically, the present invention relates to high voltage circuits in an electronic erasable programmable read only memory (EEPROM) integrated circuit (IC).

2. Related Art

Metal-oxide semiconductor field effect transistors (MOSFETs) are manufactured such that they can withstand a particular maximum voltage across any two terminals of the MOSFET. A MOSFET having a maximum voltage of $V_{max}$ is "rated" at a voltage of $V_{max}$. The maximum voltage of a MOSFET is termed the breakdown voltage of the MOSFET. A common MOSFET breakdown voltage is equal to approximately twelve volts. As the rated voltage of a MOSFET increases the associated expense in manufacturing the IC containing the MOSFET increases. The increased manufacturing expenses may be particularly acute with p-channel MOSFETs. For example, in order to manufacture an IC containing a p-channel MOSFETs rated at twenty-four volts, a significant increase in process technology and materials is required when compared to an IC containing only twelve volt rated p-channel MOSFETs.

When operating an IC it is often necessary to apply a voltage greater than twelve volts to one or more MOSFETs in the IC. Typically, higher rated MOSFETs are used in ICs to which voltages greater than twelve volts are applied. However, as discussed above, the use of such higher rated MOSFETs are not always desirable since they are more difficult and more expensive to produce.

One type of circuit which, for proper operation, requires a maximum voltage greater than twelve volts is an electronic erasable programmable read only memory (EEPROM) circuit. A general description of an EEPROM circuit 100 and how it operates is given below with reference to FIG. 1.

The EEPROM circuit 100 includes an array of EEPROM cells 102, hereafter "memory cells". These memory cells 102 are non-volatile. In other words, each memory cell 102 can store a bit of dam for ten years or more. In addition, these memory cells 102 can be erased and programmed by a user. Typically, each memory cell includes a transistor. Nodes of the transistor are connected to a row line 104, a column line 108, an erase line 106, and a ground line 110. The operation of memory cell 102 will now be described with reference to FIG. 2, which shows one of the memory cells 102 in greater detail.

In order to properly function, a memory cell 102 is typically erased, programmed and then read based on instructions output by a controlling processor (not shown). When erasing a memory cell 102, a voltage of approximately twenty-two volts is applied to the erase gate 206 via the erase line 106. When erasing a memory cell 102, the row line 104 and the column line 108 are typically "low", i.e., approximately zero volts or ground. The high voltage applied to the erase gate 206 causes a positive charge to form on the floating gate 204 of the memory cell 102. This positive charge on the floating gate 204 effectively erases the memory cell 102. That is, the memory cell is considered to store a binary "zero" when the floating gate 204 stores a positive charge. Typically, all memory cells 102 are erased before the processor (not shown) requests that some memory cells 102 be programmed to store a binary "one".

Programming a memory cell 102 typically requires that a twelve volt signal be applied to the control gate 202 of the memory cell 102 via the row line 104 while a signal having a voltage between seven and eight volts is applied to the drain 210 of the transistor within the memory cell 102 via the column line 108. The source 208 of the transistor in the memory cell 102 is held to zero volts or ground. When these potentials are applied to the memory cell the positive charge stored in the floating gate 204 during the memory cell erase operation, described above, is reduced. When the charge stored by the floating gate 204 is below a predetermined level, the memory cell 102 is considered to store a binary "one". After erasing and programming the memory cells 102, the memory cells 102 can be read. Reading a memory cell 102 is generally accomplished by applying a voltage of approximately five volts to the control gate 202 of the memory cell 102 via the row line 104 and applying a voltage of approximately one and one-half volts to the drain. Further details regarding the operation and structure of an EEPROM will be apparent to persons skilled in the relevant art.

FIG. 3 illustrates an EEPROM IC 300. Typically, EEPROM ICs do not contain the VOLTAGE REGULATOR INPUT SWITCH 318. A processor (not shown) can request that the EEPROM IC 300 erase, program or read the memory cells 102 of an EEPROM circuit 100, as described above. The processor provides a $V_{pp}$ SIGNAL 302, a $V_{dd}$ signal 304, ERASE CONTROL SIGNALs 308, a READ-OR-PROGRAM SIGNAL 314, and a PROGRAM signal 326 to the EEPROM IC 300. The value of these signals varies depending upon which operation the processor requests.

To request the erasing of an EEPROM circuit 100, the processor (not shown) outputs a potential of approximately twenty-four volts on the $V_{pp}$ SIGNAL 302 and a potential of approximately five volts on the ERASE CONTROL SIGNAL 308 associated with the EEPROM circuit 100 to be erased. The $V_{pp}$ SIGNAL 302 and the ERASE CONTROL SIGNAL 308 are input into a HIGH VOLTAGE SWITCH 306, described below. The HIGH VOLTAGE SWITCH 306 outputs a voltage of approximately twenty-two volts to the ERASE LINE of the EEPROM circuit 100 on output line 310.

To request that memory cell 102 within an EEPROM circuit 100 be programmed, the processor (not shown) outputs a potential of approximately twelve volts on the $V_{pp}$ SIGNAL 302, a potential of approximately five volts on the $V_{dd}$ SIGNAL 304 and a potential of approximately five volts on the $V_{pp}$ SWITCH INPUT LINE 314. The $V_{pp}$ SWITCH 312 outputs a potential of approximately $V_{pp}$ volts on its output line 316 when the $V_{pp}$ SWITCH INPUT LINE 314 is high, i.e., the signal voltage is approximately five volts. As stated above, when programming the EEPROM circuit, $V_{pp}$ is approximately twelve volts. Typical EEPROM ICs do not include the VOLTAGE REGULATOR INPUT CIRCUIT 318 which in the present invention ensures that the VOLTAGE REGULATOR 324 input signal VPPZ will not have a voltage which exceeds twelve volts. Instead, the VPPZ SIGNAL 322 is input directly into VOLTAGE REGULATOR 324 along with the PROGRAM signal 326 and the $V_{dd}$ SIGNAL 304. When programming a memory cell 102, the VOLTAGE REGULATOR outputs a signal having a voltage between seven volts and eight volts on the VOLTAGE REGULATOR OUTPUT LINE 328. This output signal is sent to COLUMN PROGRAM CIRCUITS (not shown) within the EEPROM circuit 100.

As discussed above, to request that the EEPROM circuit 100 be read, the processor outputs a potential of approximately five volts on the $V_{pp}$ SIGNAL 302 and a potential of approximately five volts on the $V_{dd}$ SIGNAL 304. The detailed operation of the EEPROM IC 300 during a READ operation will be apparent to persons skilled in the relevant art.

In the typical EEPROM IC 300, the HIGH VOLTAGE SWITCH 306, the $V_{pp}$ SWITCH 312, and the VOLTAGE REGULATOR 324 will all be exposed to a potential of approximately twenty-four volts when the processor (not shown) requests that an EEPROM circuit 100 be erased, as described above. When a twenty-four volt potential is applied to a circuit, the high voltage circuits 306, 312, and 324 are typically designed such that some p-channel transistors within the high voltage circuits 306, 312, and 324 have a rating of, at least, twenty-four volts. A typical HIGH VOLTAGE SWITCH 306, $V_{pp}$ SWITCH 312, and VOLTAGE REGULATOR 324 will now be described in greater detail.

In FIGS. 4–6, a transistor having a circle at its control gate is a p-channel metal oxide semiconductor field effect transistor (MOSFET). If the transistor does not have a circle at its control gate then it is an n-channel MOSFET. If the MOSFET has an "X" it its channel then it is a twenty-four volt rated MOSFET, otherwise it is a twelve volt rated MOSFET. If the back-gate connection is not explicitly shown, it is connected to $V_{ss}$, or ground, if the transistor is an n-channel MOSFET or to $V_{pp}$ if the transistor is a p-channel MOSFET.

FIG. 4 illustrates a schematic of a typical HIGH VOLTAGE SWITCH 306. Transistors 402, 406, and 408 are each n-channel MOSFETs which are rated at twenty-four volts. Transistor 404 is a p-channel MOSFET rated at twenty-four volts. Additionally, transistor 404 is a "weak" transistor, i.e., when the transistor conducts it has a high resistance.

There can be many EEPROM circuits 100 in an EEPROM IC 300. A HIGH VOLTAGE SWITCH 306 is typically associated with each EEPROM circuit 100, as shown in FIG. 3. To request that an EEPROM circuit be erased, the processor (not shown) outputs a twenty-four volt potential on the $V_{pp}$ SIGNAL 302, as described above. When the input signal voltage, IN, is "high", i.e., approximately five volts, the output signal 310 voltage of the HIGH VOLTAGE SWITCH 306 is approximately equal to $V_{ss}$. When the input signal voltage, IN, is "low", i.e. approximately zero volts, the output signal voltage of the HIGH VOLTAGE SWITCH 310 is approximately equal to: $V_{pp}$ minus the threshold voltage of transistor 406. Transistor threshold voltages are described below. Further details pertaining to the structure and operation of the circuit shown in FIG. 4 will be apparent to persons skilled in the relevant art.

The reason why the p-channel MOSFET 404 which is rated at twenty-four volts 404 is used in this circuit shall now be described. If the input, IN, is "high", MOSFET 402 conducts, thereby pulling the voltage on node N10 down to approximately zero volts. Simultaneously, p-channel MOSFET 404 also conducts, since its gate input voltage, i.e., five volts, is significantly less than its drain voltage, i.e., twenty-four volts. However, because transistor 404 is a weak device, as described above, transistors 404 and 402 will act as a voltage divider having a significant voltage drop across transistor 404. Therefore, the voltage at node N10 will be close to zero volts. In this situation, the voltage drop across the p-channel transistor 404 is approximately twenty-four volts. Therefore, transistor 404 must be rated at a minimum of twenty-four volts in order to prevent transistor 404 from breaking-down.

The HIGH VOLTAGE SWITCH circuit 306 could alternatively be designed using a well known charge-pump circuit (not shown). Such a circuit does not require a p-channel MOSFET rated at twenty-four volts. However, the circuit does require n-channel MOSFETs rated at twenty-four volts whose characteristics, e.g., threshold voltage, are known with high precision. Such n-channel transistors are expensive to manufacture and, therefore, circuits requiring such precise transistors are not desirable.

As stated above, it is often unacceptable to design a circuit within an EEPROM IC 300 which requires the use of p-channel MOSFETs rated higher than twelve volts. Therefore, a circuit performing the same functions as the HIGH VOLTAGE SWITCH 306, described above, which does not employ any p-channel MOSFETs rated higher than twelve volts is desirable.

FIG. 5 is a schematic of a typical $V_{pp}$ SWITCH 312. Transistor 502 is a twenty-four volt rated p-channel MOSFET. Transistors 504 and 506 are twenty-four volt rated n-channel MOSFETs. Transistor 508 is a twelve-volt rated p-channel MOSFET. Additionally, transistor 508 is a weak transistor.

The $V_{pp}$ SWITCH 312 outputs a voltage signal VPPW which is equal to the voltage of the $V_{pp}$ SIGNAL 302 when the $V_{pp}$ SWITCH input, IN 314, is high. The input, IN 314, is high only when the processor has requested that the EEPROM circuit 100 be programmed or read. That is, when the processor requests that an erase be performed on the EEPROM circuit 100, and consequently the voltage on the $V_{pp}$ SIGNAL 302 is approximately twenty-four volts, the input, IN 314, is low. When the input, IN, is low, the output signal VPPW is approximately equal to the voltage on the $V_{dd}$ SIGNAL 304, i.e., five volts. Further details pertaining to the structure and operation of the circuit shown in FIG. 5 will be apparent to persons skilled in the relevant art.

As stated above, when the $V_{pp}$ SWITCH input, IN 314, is low, and $V_{pp}$ SIGNAL 302 has a voltage of approximately twenty-four volts, the voltage of the output signal VPPW is equal to $V_{dd}$, i.e., approximately five volts. Therefore, the voltage drop across the source and the drain of transistor 502, and across the control gate and the drain of transistor 502 is approximately nineteen volts, i.e., ($V_{pp}$–$V_{dd}$). Therefore, transistor 502 must be rated above twelve volts in order to prevent the transistor 502 from breaking down.

The $V_{pp}$ SWITCH 312 could alternatively be designed using a well known charge-pump circuit (not shown). Such a circuit does not require a p-channel MOSFET rated at twenty-four volts. However, the circuit does require n-channel MOSFETs rated at twenty-four volts whose characteristics, e.g., voltage threshold, are known with high precision. Such n-channel transistors are expensive to manufacture and are, therefore, undesirable.

As stated above, it is often unacceptable to design a circuit within an EEPROM IC 300 which requires the use of a twenty-four volt rated p-channel MOSFET. Therefore, a circuit performing the same functions as the $V_{pp}$ SWITCH 312, described above, which does not employ any p-channel MOSFETs rated higher than twelve volts is desirable.

A typical VOLTAGE REGULATOR 324 is shown in FIG. 6A and FIG. 6B. FIG. 6A is the portion of the VOLTAGE REGULATOR 324 which performs the functions of the VOLTAGE REGULATOR INPUT CIRCUIT 318 illustrated in FIG. 3. The output VPPZ is input into the portion of the VOLTAGE REGULATOR 324 shown in FIG. 6B. Transistors 602, 604, 606 and 608 are twenty-four volt rated p-channel MOSFETs. Transistors 610, 612 and 614 are twenty-four volt rated n-channel MOSFETs. Transistor 618 is a twelve volt rated p-channel MOSFET. Device 616 is an inverter.

FIG. 6A illustrates a logic circuit which has as its input, IN, a NOT-PROGRAM signal, i.e., the inverted PROGRAM signal 326. When the input, IN, is high, a voltage of twenty-four volts can be input into the circuit via the $V_{pp}$ SIGNAL 302. In this situation the circuit shown in FIG. 6A will output a twelve volt signal at node VPPZ. When the input, IN, is low, a voltage of twelve volts, $V_{pp}$, must be input into the circuit via $V_{pp}$ SIGNAL 302. In this situation the circuit shown in FIG. 6A will output a twelve volt signal at node VPPZ. Further details pertaining to the structure and operation of the circuit shown in FIG. 6A will be apparent to persons skilled in the relevant art.

The twenty-four volt rated p-channel MOSFETs 602, 604, 606, and 608 are used in FIG. 6A because the voltage across their source and drain can be above twelve volts. For example, when the input, IN, is high, i.e., approximately five volts, and the $V_{pp}$ SIGNAL voltage is twenty-four volts, transistor 602 conducts. The difference between the transistor's 602 drain voltage and the transistor's 602 control gate voltage is approximately nineteen volts, i.e., $(V_{pp}-V_{dd})$. Therefore, transistor 602 must be rated above twelve volts in order to prevent the transistor from breaking-down.

As stated above, it is often unacceptable to design a circuit within an EEPROM IC 300 which requires the use of p-channel MOSFETs rated above twelve volts. Therefore, a circuit performing the same functions as the VOLTAGE REGULATOR 324 described above, which does not employ any p-channel MOSFETs rated higher than twelve volts is desirable.

The VOLTAGE REGULATOR 324 shown in FIG. 6B provides an output signal V7 having a voltage between seven volts and eight volts when the processor (not shown) requests that a programming operation be performed on an EEPROM circuit 100. Transistors 632 and 634 are five volt rated n-channel MOSFETs. The remaining transistors are twelve volt rated n-channel MOSFETs. Blocks 620 and 636 are well known voltage dividers. No twenty-four volt rated MOSFETs are necessary since the input, VPPZ, never exceeds twelve volts because VPPZ is output from the circuit illustrated in FIG. 6A which limits the voltage on the VPPZ signal.

The VOLTAGE REGULATOR 328 inputs the PROGRAM signal 326, shown as INX in FIG. 6B. The input, INX, is high when the processor (not shown) requests that a memory cell be programmed, as discussed above. The VOLTAGE REGULATOR output signal V7 has a voltage between seven volts and eight volts when the input, INX, is high. The transistors 622–630 of the voltage divider 620 are chosen such that the size, and therefore, the resistance between the drain and the source, of transistor 622 when compared to the size of transistors 624–630 enables the output signal V7 voltage to be within the acceptable output range, i.e., between seven volts and eight volts. Threshold voltages can vary between transistors on different integrated circuit chips, even when the transistors have the same nominal threshold voltage.

Transistor 622 is manufactured having a nominal threshold voltage, e.g., 2.5 volts. In an n-channel MOSFET, the transistor 622 conducts if a control gate voltage is at least one threshold voltage $V_{TH}$ above the source voltage of the transistor, i.e., the voltage on signal V7. As discussed above, the threshold voltage can vary from the nominal threshold voltage. The output signal V7 voltage is affected by the threshold voltage variations in transistors 622 and 640. A VOLTAGE REGULATOR 322 which is more independent of threshold voltage variations of individual transistors is desirable. Further details pertaining to the structure and operation of the VOLTAGE REGULATOR of FIG. 6A and 6B will be apparent to persons skilled in the relevant art.

What are required are a HIGH VOLTAGE SWITCH, a $V_{pp}$ SWITCH, and a VOLTAGE REGULATOR INPUT CIRCUIT for use in an EEPROM IC 300 which do not require the use of a p-channel MOSFETs rated above twelve volts. In addition, what is needed is a VOLTAGE REGULATOR which more precisely regulates its output voltage when the MOSFETs which comprise the VOLTAGE REGULATOR have threshold voltages which deviate from their nominal threshold voltages.

SUMMARY OF THE INVENTION

The present invention is a plurality of circuits for receiving a high-voltage signal and for generating an output signal based on a received control signal, on an electronic erasable programmable read only memory (EEPROM) integrated circuit (IC). The plurality of circuits each having p-channel metal-oxide semiconductor field effect transistors (MOSFETs) whose breakdown voltage does not exceed twelve volts. The circuits including a high-voltage switch, a switch, and two voltage regulators.

A high-voltage switch for receiving a driver signal and a control signal. The high-voltage switch generates an output signal having a voltage not exceeding twelve volts when the control signal voltage is approximately equal to a first value, and wherein the output signal has a voltage exceeding twelve volts when the control signal voltage is approximately equal to a second value and when the driver signal exceeds twelve volts.

A switch for receiving a first driver signal and a control signal. The switch generates an output signal on an output having a voltage not exceeding twelve volts. The output signal equal to the first driver signal when the control signal voltage is approximately equal to a first value. The output signal equal to a second driver signal, having a voltage less than twelve volts, when the control signal voltage is approximately equal to a second value.

A voltage regulator for receiving a driver signal and a control signal, and for generating an output signal having a voltage not exceeding twelve volts.

A voltage regulator for receiving a driver signal and a control signal, and for generating an output signal having a voltage approximately equal to a first voltage when the control signal voltage is approximately equal to a first value.

BRIEF DESCRIPTION OF THE FIGURES

The foregoing and other objects, features and advantages of the invention will be apparent from the following more particular description of the preferred embodiments of the invention, as illustrated in the accompanying drawings, wherein.

DETAILED DESCRIPTION OF THE PREFERRED EMBODIMENTS

A preferred embodiment of the present invention is now described with reference to the figures where like reference numbers indicate identical or functionally similar elements. Also in the figures, the left most digit of each reference number corresponds to the figure in which the reference number is first used. While specific steps, configurations and arrangements are discussed, it should be understood that this is done for illustrative purposes only. A person skilled in the relevant art will recognize that other steps, configurations and arrangements can be used without departing from the spirit and scope of the invention.

In the figures, a transistor having a circle adjacent to the control gate is a p-channel metal oxide semiconductor field effect transistor (MOSFET). If the transistor does not have a circle adjacent to the control gate then it is an n-channel MOSFET. If the MOSFET has an "X" in its channel, then it is a twenty-four volt rated MOSFET, otherwise it is a twelve volt rated MOSFET. If the back-gate connection is not explicitly shown, it is connected to $V_{ss}$ or ground if the transistor is an n-channel MOSFET or to $V_{pp}$ if the transistor is a p-channel MOSFET. A suggested width and length of the channel of each transistor are labeled adjacent to the transistor in microns (μ). If only one number is given, the number represents the suggested width of the transistor. The suggested length of such transistors is 0.9μ.

The present invention is directed to an EEPROM IC 300 having a number of innovative high voltage components. The high voltage components include a HIGH VOLTAGE SWITCH, a $V_{pp}$ SWITCH, and a VOLTAGE REGULATOR INPUT CIRCUIT for use in an EEPROM IC 300 which do not require the use of a p-channel MOSFETs rated above twelve volts. In addition, the present invention is directed to an EEPROM IC 300 having a VOLTAGE REGULATOR which more precisely regulates its output voltage when the MOSFETs which comprise the VOLTAGE REGULATOR have threshold voltages which deviate from their nominal threshold voltages.

Figure 1:
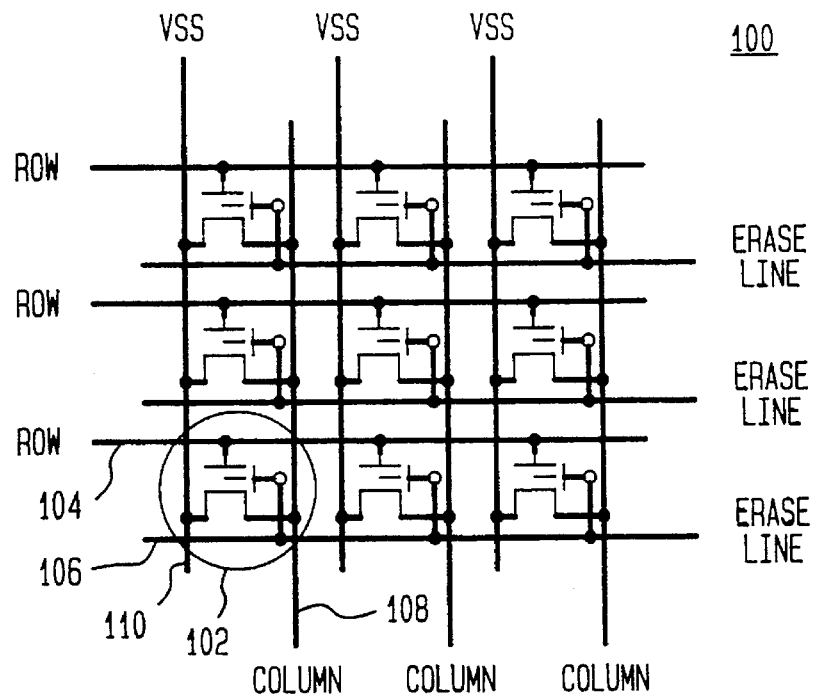
FIG. 1 is a schematic of the EEPROM circuit according to a preferred embodiment.
Figure 2:
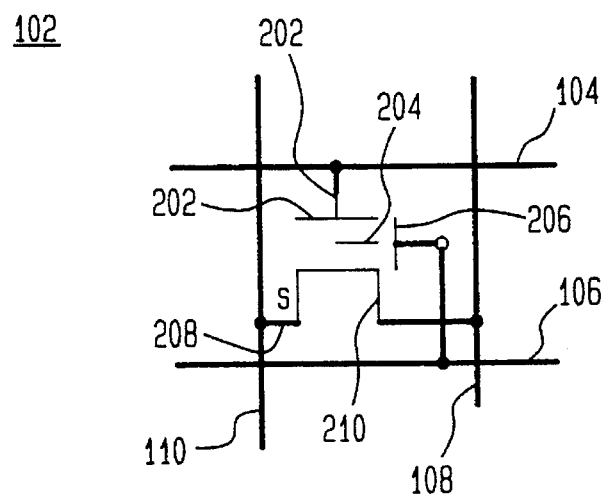
FIG. 2 is a schematic of the memory cell according to a preferred embodiment.
Figure 3:
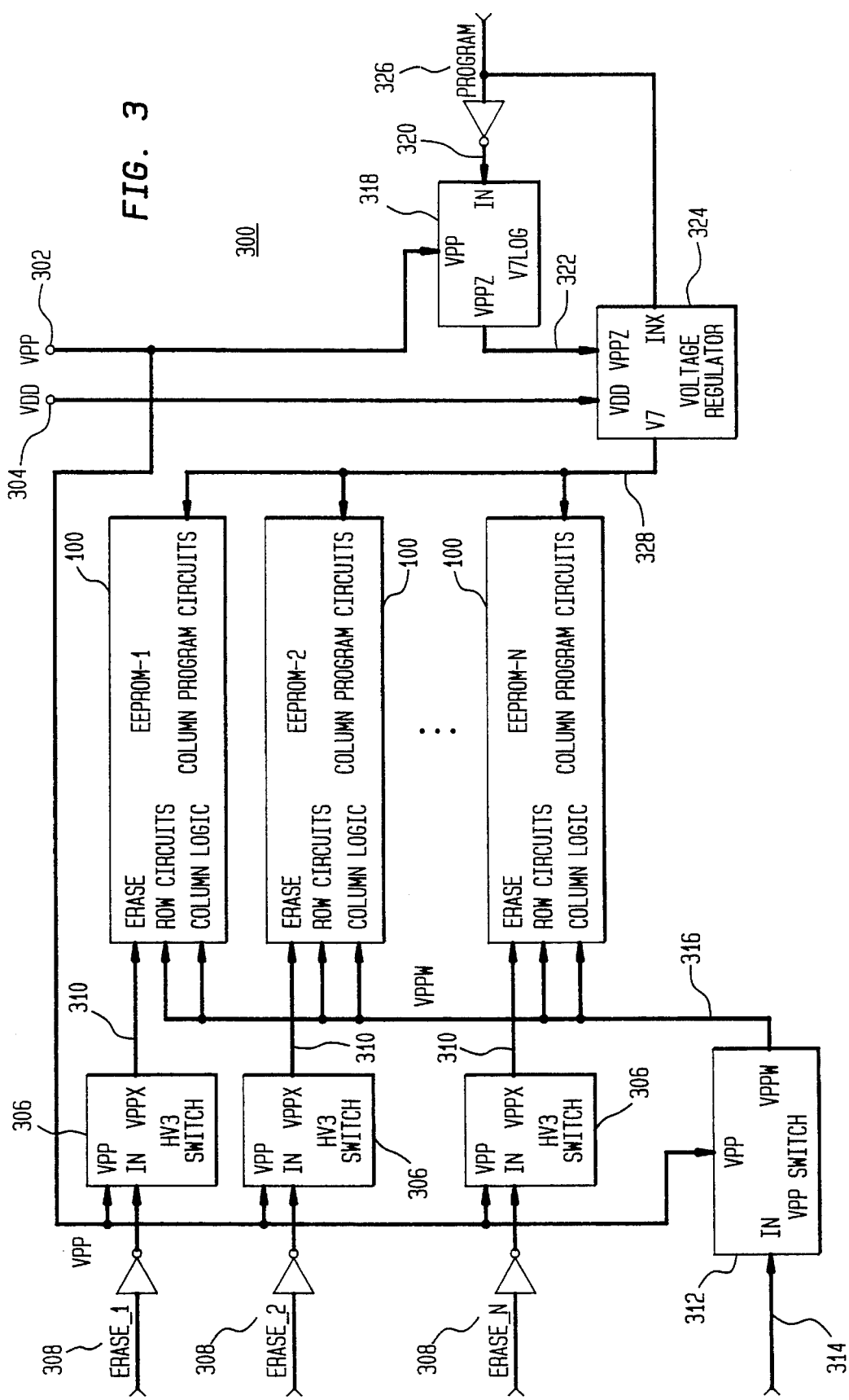
FIG. 3 is an illustration of the EEPROM integrated circuit (IC) according to a preferred embodiment.

FIG. 3 is a block diagram of an EEPROM IC 300 according to a preferred embodiment of the present invention. As discussed above, the EEPROM IC 300 include a number of innovative high voltage components, including a HIGH VOLTAGE SWITCH 306, a $V_{pp}$ SWITCH 312, a VOLTAGE REGULATOR INPUT CIRCUIT 318, and a VOLTAGE REGULATOR 324. These circuits will now be discussed.

While the high voltage components of the present invention are described herein with respect to an EEPROM IC 300, it should be understood that these high voltage components can be used with any other IC in which signals having high voltages are manipulated.

High Voltage Switch

The HIGH VOLTAGE SWITCH 306 of the present invention shall now be described with reference to FIG. 7. A conventional HIGH VOLTAGE SWITCH 306 which uses twenty-four volt rated p-channel MOSFETs is described above with reference to FIG. 4. As stated above, a circuit designed using twelve volt rated p-channel MOSFETs is preferable to a circuit designed using twenty-four volt rated p-channel MOSFETs. The present invention alleviates the need for p-channel MOSFETs rated above twelve volts in a HIGH VOLTAGE SWITCH 306.

The HIGH VOLTAGE SWITCH 306 of the present invention outputs a signal, VPPX, which has a voltage of approximately twenty-two volts when the HIGH VOLTAGE SWITCH input 306, IN, is low and the voltage on the $V_{pp}$ SIGNAL 302 is twenty-four volts. When the input, IN, is high, the output signal, VPPX, has a voltage close to zero volts or ground. The HIGH VOLTAGE SWITCH 306 of the present invention will now be described in greater detail.

Figure 4:
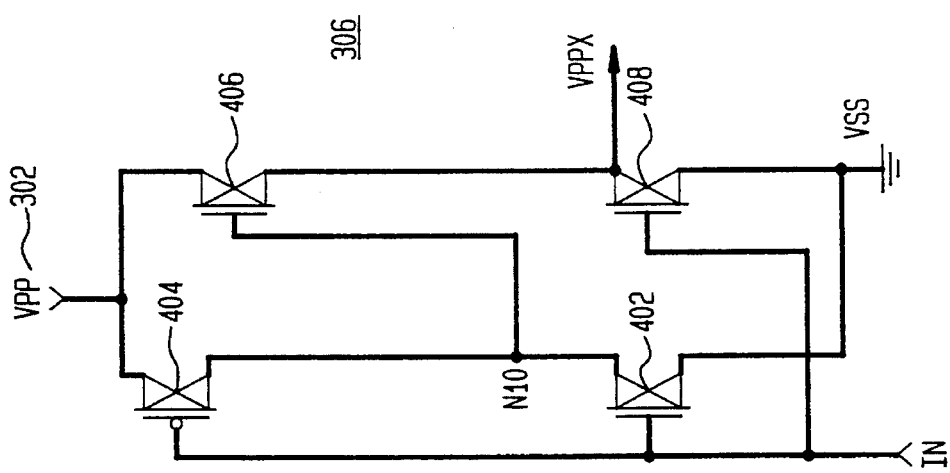
FIG. 4 is a schematic of a typical HIGH VOLTAGE SWITCH.

Transistors 402, 406 and 408 are each twenty-four volt rated n-channel MOSFETS, as described in FIG. 4. The twenty-four volt rated p-channel MOSFET 404 of FIG. 4 is replaced with twelve volt rated p-channel MOSFETs 710, 712, and 714, and biasing circuits 702, and 704. Biasing circuit 702 is a well known voltage divider circuit which outputs a voltage signal on node N3 and a voltage signal on node N4. Biasing circuit 704 is a well known voltage divider circuit which outputs a voltage signal on node N15. Generating biasing voltages is well known. Preferably, biasing circuit 702 generates the voltages at nodes N3 and N4 after receiving the $V_{pp}$ SIGNAL 302.

The biasing circuit 702 is designed such that an approximately equal voltage drop occurs across each transistor within the biasing circuit. Therefore, the voltage at node N3 is equal to five-sevenths of the voltage on the $V_{pp}$ SIGNAL 302. Similarly, the voltage at node N4 is equal to four-sevenths of the voltage on the $V_{pp}$ SIGNAL 302.

The biasing circuit 704 operates in a manner similar to biasing circuit 702. However, there are some differences between the two biasing circuits 702, 704. When the input, IN is low, transistor 716 does not conduct. Therefore, transistor 718 and transistor 720 do not provide node N15 with a path to ground. Therefore, when the input IN is low the voltage on node N15 is unaffected by transistors 718 and 720. When the input IN is low the voltage on node N15 is approximately equal to one-half the voltage on the $V_{pp}$ SIGNAL 302. When the input, IN is high, transistor 716 conducts. The series resistance of transistors 718 and 720 are significantly less than the series resistance of transistors 728, 730 and 732. The resistance between node N15 and node N30 is therefore, greater than the resistance between node N15 and N32. Consequently, when the input IN is high the voltage at node N15 decreases since a greater percentage of voltage drops across transistors 722, 724 and 726.

The voltage signal on node N3 provides a biasing voltage to transistor 710. The voltage signal on node N4 provides a biasing voltage to transistor 712. The voltage signal on node N15 provides a biasing voltage to transistor 714.

The HIGH VOLTAGE SWITCH input, IN, is low only when the processor requests that a portion of the EEPROM circuit 100 associated with the HIGH VOLTAGE SWITCH 306 be erased. As described above, in order to erase a memory cell 102 within an EEPROM circuit 100, a voltage of approximately twenty-two volts must be applied to the erase gate 206 of the memory cell 102. The HIGH VOLTAGE SWITCH 306 supplies this twenty-two volt signal to the EEPROM circuit 100 when the input, IN is low. When the input, IN, is high, the signal at the HIGH VOLTAGE SWITCH output VPPX has a voltage of approximately zero volts or ground.

Figure 7:
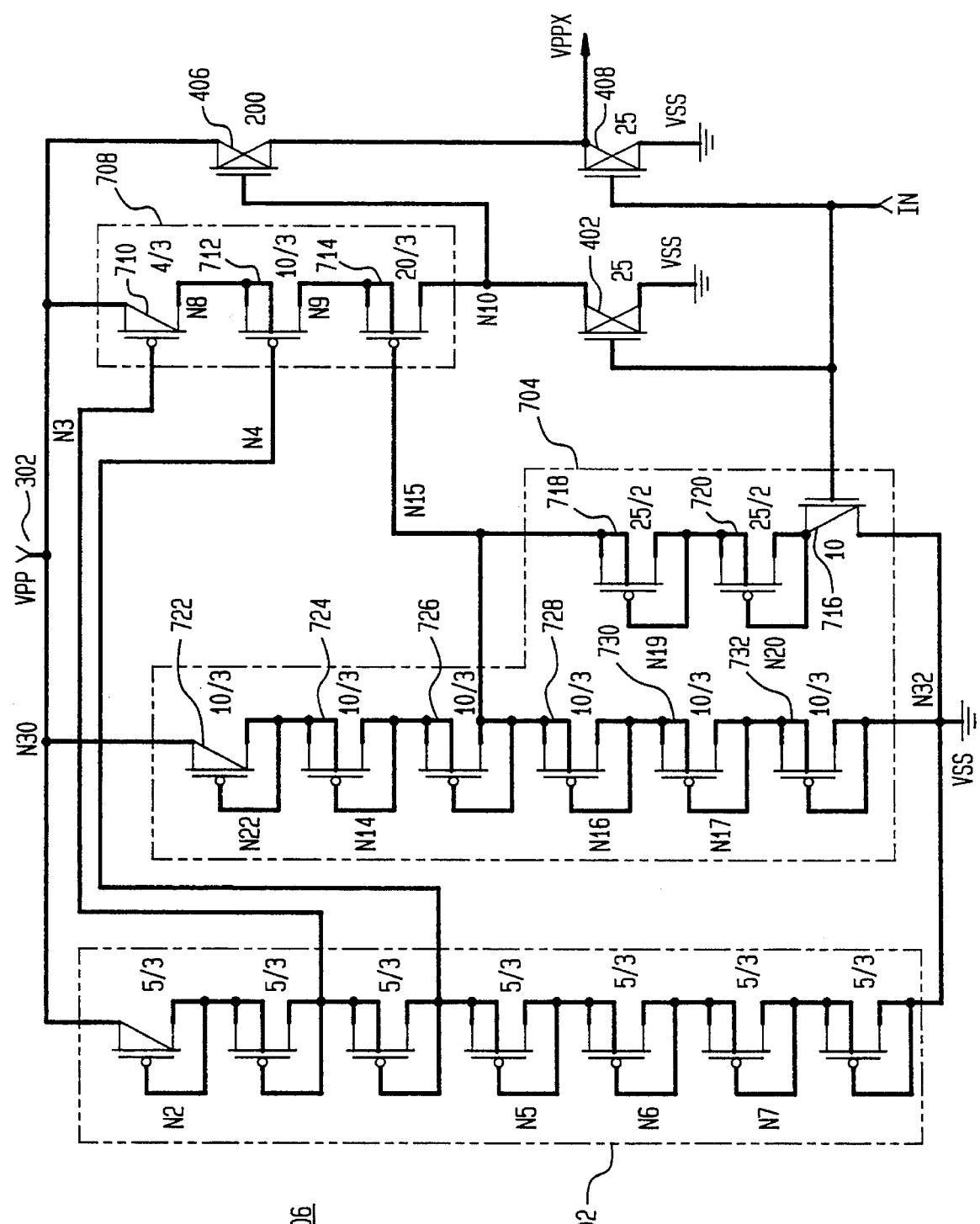
FIG. 7 is a schematic of the HIGH VOLTAGE SWITCH according to a preferred embodiment.

A unique aspect of the HIGH VOLTAGE SWITCH 306 as shown in FIG. 7 is that at no time will the voltage across any two terminals of a p-channel MOSFET be larger than twelve volts. Therefore, the highest rated p-channel MOSFET required in the HIGH VOLTAGE SWITCH 306 of the present invention is rated at twelve volts. How the HIGH VOLTAGE SWITCH 306, illustrated in FIG. 7, accomplishes the required functions without requiring a p-channel MOSFET rated above twelve volts is described below.

In the preferred embodiment, there is no concern that a p-channel MOSFET will have a voltage differential greater than twelve volts when the $V_{pp}$ SIGNAL is twelve volts or less. In the present invention, the only situation where a p-channel MOSFET rated above twelve volts could even potentially be necessary is when the voltage on the $V_{pp}$ SIGNAL is greater than twelve volts. Therefore, the following analysis will focus on the situation when a twenty-four volt potential is applied to the HIGH VOLTAGE SWITCH 306 via the $V_{pp}$ SIGNAL.

When twenty-four volts are applied to the HIGH VOLTAGE SWITCH 306, the voltage divider 702 outputs a signal on node N3 having a potential of approximately 17.1 volts, i.e., ($5V_{pp}/7$). In addition, the voltage divider 702 outputs a signal on node N4 having a potential of approximately 13.7 volts, i.e., ($4V_{pp}/7$). The voltage divider 704 outputs a signal on node N15 having a voltage of approximately twelve volts, i.e., ($V_{pp}/2$), when the input, IN, is low.

When the input IN is high, the voltage on node N15 is reduced due to the operation of transistors 718, and 720, discussed above, in the biasing circuit 704, which reduces the resistance between node N15 and ground which consequently reduces the voltage at node N15. Therefore, the voltage at node N15 will be less than twelve volts. The voltages at nodes N3, N4, and N15 are applied to the control gates of p-channel MOSFETs 710, 712 and 714 respectively. When the input IN is high, transistor 402 conducts, thereby pulling node N10 to ground. That is, transistor 402 acts a controllable shunt for pulling node N10 to ground when the input signal IN is high. Therefore, the voltage drop between node N30 and node N10 is approximately twenty-four volts. In the present invention the voltage drops across three p-channel transistors instead of one.

The three twelve volt rated p-channel MOSFETs 710, 712, and 714 are biased by the signals N3, N4 and N15, such that the voltage at node N8 is approximately sixteen volts and the voltage at node N9 is approximately eight volts. Therefore, no p-channel MOSFET in the HIGH VOLTAGE SWITCH 306 has a voltage greater than twelve volts across any of its terminals. As such, no p-channel MOSFET must be rated above twelve volts in the HIGH VOLTAGE SWITCH 306 of FIG. 7.

The presence of voltage dividers 702 and 704 and twelve-volt rated MOSFETs 710, 712, and 714 enable the HIGH VOLTAGE SWITCH 306 of FIG. 7 to receive a twenty-four volt signal without requiring a p-channel MOSFET rated above twelve volts.

Additional features pertaining to the operation of the HIGH VOLTAGE SWITCH 306 will be apparent to persons skilled in the relevant art based on FIG. 7, the above discussion, and general circuit theory.

$V_{pp}$ Switch

The $V_{pp}$ SWITCH 312 of the present invention shall now be described with reference to FIG. 8. A conventional $V_{pp}$ SWITCH 312 using twenty-four volt rated p-channel MOSFETs is described above with reference to FIG. 5. As stated above, a circuit designed using twelve volt rated p-channel MOSFETs is preferable to a circuit designed using twenty-four volt rated p-channel MOSFETs. The present invention alleviates the need for a $V_{pp}$ SWITCH 312 to utilize p-channel MOSFETs rated above twelve volts.

The $V_{pp}$ SWITCH 312 of the present invention outputs a signal, VPPW, which has a voltage which is approximately equal to the voltage on the $V_{pp}$ SIGNAL 302 when the $V_{pp}$ SWITCH input, IN, is high. When the input, IN, is low, the output signal, VPPW, has a voltage close to the voltage on the $V_{dd}$ SIGNAL 304 which is typically approximately five volts. The $V_{pp}$ SWITCH 312 will now be described in greater detail.

Figure 5:
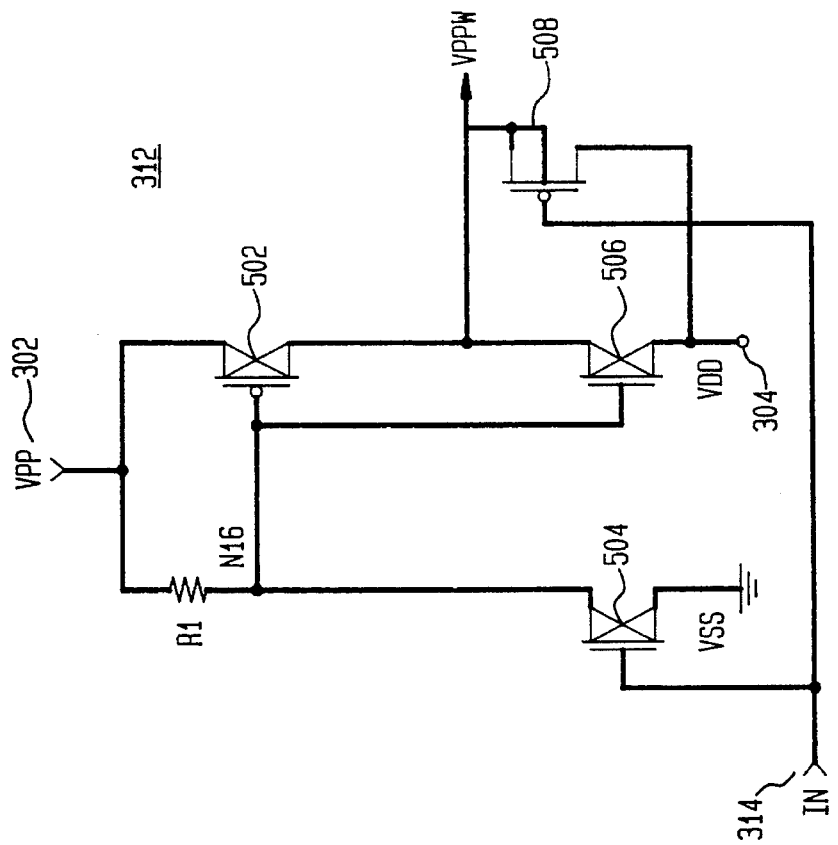
FIG. 5 is a schematic of a typical $V_{pp}$ SWITCH.

Transistors 504 and 808 are each a twenty-four volt rated n-channel MOSFET. Transistor 506 is a twelve volt rated n-channel MOSFET. The remaining transistors are each a twelve volt rated p-channel MOSFET. The twenty-four volt rated p-channel MOSFET 502 illustrated in FIG. 5 is replaced with voltage divider 804, voltage divider 806, n-channel MOSFET 808 and p-channel MOSFETs 810 and 812. Voltage dividers 804, 806 are well known circuits. Voltage dividers 804, 806 each operate in a manner similar to voltage divider 702, described above. As such it is apparent that voltage divider 804 outputs a signal on node N4 having a voltage approximately equal to one-half the voltage on $V_{pp}$ SIGNAL 302. Voltage divider 806 outputs a signal on node N10 having a voltage approximately equal to one-half the voltage on $V_{pp}$ SIGNAL 302.

As described above, the $V_{pp}$ SWITCH input, IN, is high only when the processor (not shown) requests that a portion of the EEPROM circuit 100 be programmed or read. Therefore, when an EEPROM circuit 100 is to be erased the input, IN, of the $V_{pp}$ SWITCH 312 is low. The $V_{pp}$ SWITCH 312 supplies a voltage equal to that on the $V_{pp}$ SIGNAL 302 when the $V_{pp}$ SWITCH input, IN, is high. Otherwise, e.g., when erasing, the $V_{pp}$ SWITCH output VPPW is approximately equal to $V_{dd}$, i.e., approximately five volts.

Figure 8:
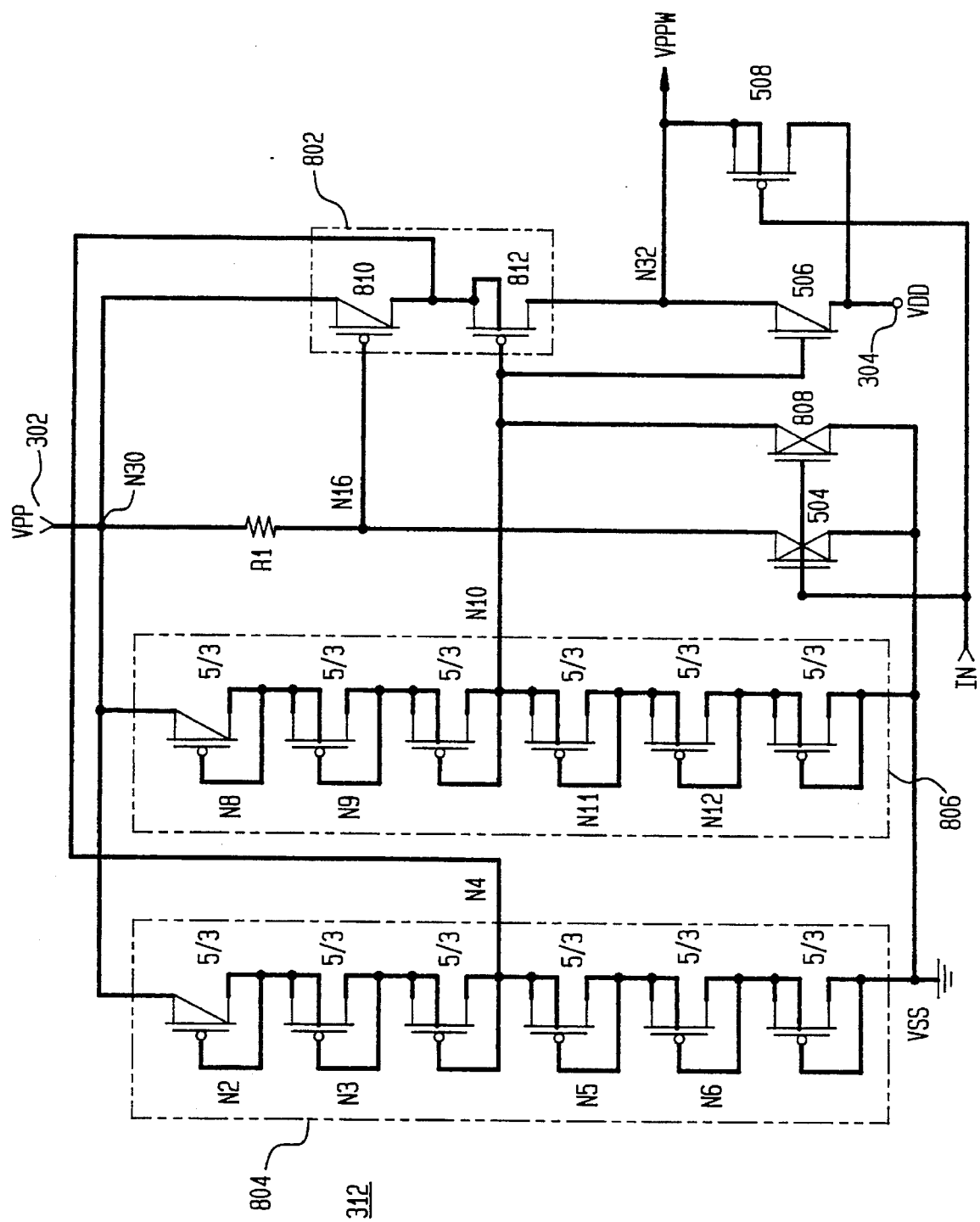
FIG. 8 is a schematic of the $V_{pp}$ SWITCH according to a preferred embodiment.

A unique aspect of the $V_{pp}$ SWITCH 312 as shown in FIG. 8 is that at no time will the voltage across any two terminals of a p-channel MOSFET be larger than twelve volts. Therefore, the highest rated p-channel MOSFET required in the $V_{pp}$ SWITCH 312 of the present invention is rated at twelve volts. How the $V_{pp}$ SWITCH 312 illustrated in FIG. 8 accomplishes the required functions without requiring a p-channel MOSFET rated above twelve volts is described below.

In the preferred embodiment, there is no concern that a p-channel MOSFET will have a voltage differential of greater than twelve volts when the $V_{pp}$ SIGNAL is twelve volts or less. That is, the only situation in which a p-channel MOSFET rated above twelve volts could even potentially be required is when the voltage on the $V_{pp}$ SIGNAL is greater than twelve volts. Therefore, the following analysis will focus on the situation where a twenty-four volt potential is applied to the $V_{pp}$ SWITCH 312.

When twenty-four volts are applied to the $V_{pp}$ SWITCH 312 the $V_{pp}$ SWITCH input, IN, must be low because the EEPROM IC 300 is neither reading from an EEPROM circuit 100 nor programming to an EEPROM circuit 100. When the $V_{pp}$ SIGNAL voltage is approximately twenty-four volts, voltage divider 804 outputs a signal on node N4 having a potential of approximately twelve volts, i.e., ($V_{pp}$/2). Simultaneously, voltage divider 806 outputs a signal onto node N10 having a voltage of approximately twelve volts, i.e., ($V_{pp}$/2). When the $V_{pp}$ SWITCH input, IN, is low, the $V_{pp}$ SWITCH output, VPPW, is equal to approximately $V_{dd}$, i.e., five volts. Therefore a voltage drop of approximately nineteen volts, i.e., ($V_{pp}$–$V_{dd}$) can appear between node N30 and node N32 when the $V_{pp}$ SWITCH input is low and the voltage on $V_{pp}$ SIGNAL is twenty-four volts.

Two transistors, coupled in series, are between node N30 and node N32. When the $V_{pp}$ SWITCH input IN is low and the voltage on $V_{pp}$ SIGNAL 302 is twenty-four volts the voltage on node N16 is approximately twenty-four volts, because transistor 504 does not conduct. As such, transistor 810 does not conduct because the voltage at the control gate of p-channel transistor 810 is equal to the voltage at the p-channel transistor's 810 drain. As stated above, twelve volts are present at node N4. Therefore, a voltage drop of approximately twelve volts occurs between the drain and the source of transistor 810. Since the voltage at node N10 is approximately twelve volts, transistor 812 will not conduct because the voltage at the control gate of transistor 812 is equal to the voltage at the drain of the transistor 812. Since the voltage on output signal VPPW is equal to five volts, a voltage drop of approximately seven volts occurs between the drain and the source of transistor 812, i.e. between node N4 and node N32. Therefore, no p-channel MOSFET has a voltage greater than twelve volts across any of their terminals. As such, no p-channel MOSFET must be rated above twelve volts in the $V_{pp}$ SWITCH 312 of FIG. 8.

The presence of voltage dividers 802 and 804, n-channel transistor 808 and p-channel transistors 810, 812 enable the $V_{pp}$ SWITCH 312 of FIG. 8 to receive a twenty-four volt signal without requiring a p-channel MOSFET rated above twelve volts.

Additional features pertaining to the operation of the $V_{pp}$ SWITCH 312 will be apparent to persons skilled in the relevant art based on FIG. 8, the above discussion, and general circuit theory.

Voltage Regulator Input Circuit

Figure 6A:
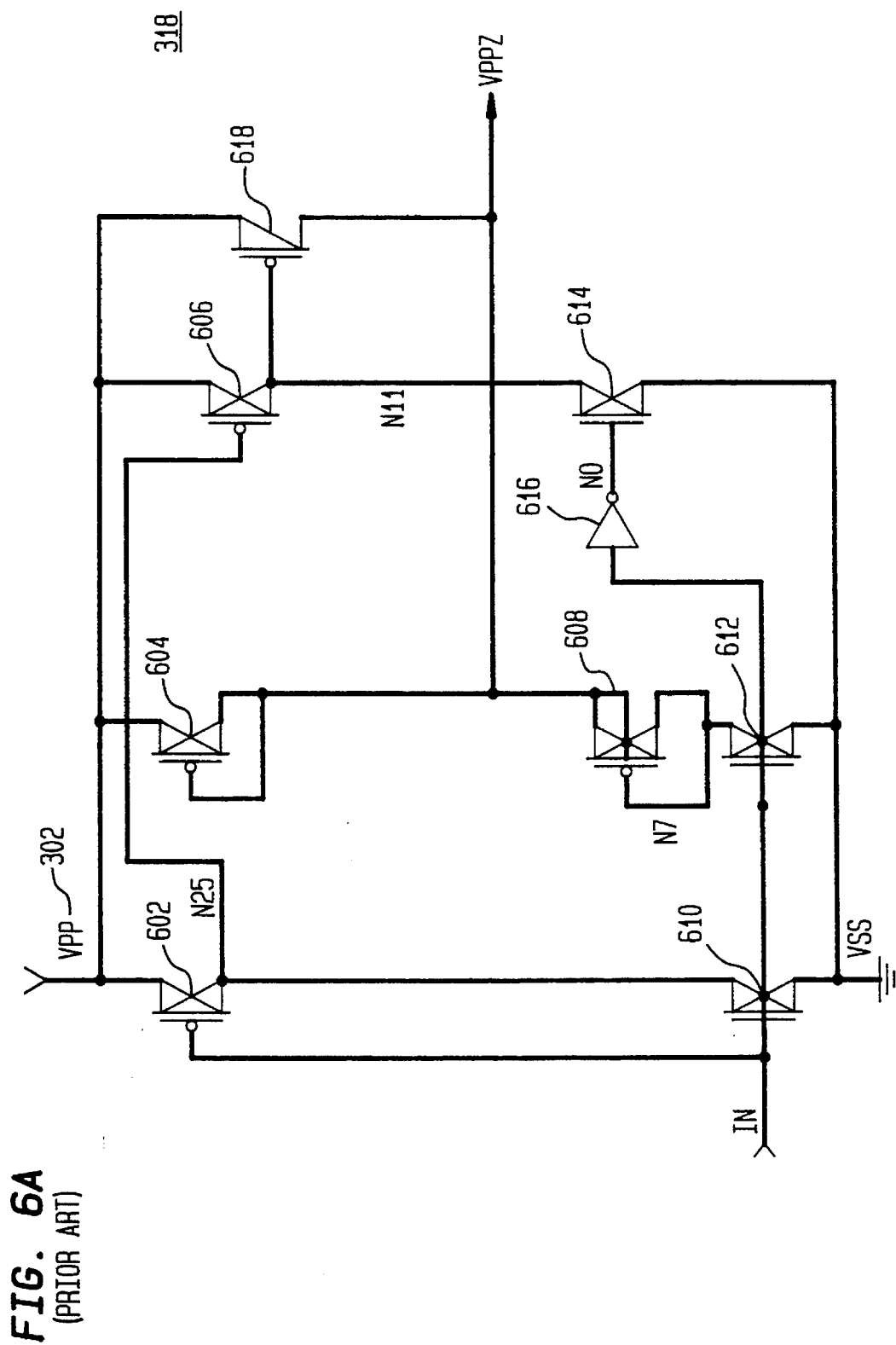
FIG. 6A is a schematic of a section of a typical VOLTAGE REGULATOR which performs the function of a VOLTAGE REGULATOR INPUT CIRCUIT.

The VOLTAGE REGULATOR INPUT CIRCUIT 318 of the present invention shall now be described with reference to FIG. 9. A conventional VOLTAGE REGULATOR INPUT CIRCUIT 318 using twenty-four volt rated p-channel MOSFETs is described above with reference to FIG. 6A. As stated above, a circuit designed using twelve volt rated p-channel MOSFETs is preferable to a circuit designed using twenty-four volt rated p-channel MOSFETs. The present invention alleviates the need for a VOLTAGE REGULATOR INPUT CIRCUIT 318 to utilize p-channel MOSFETs rated above twelve volts.

The VOLTAGE REGULATOR INPUT CIRCUIT 318 of the present invention outputs a signal, VPPZ, which has a voltage approximately equal to one half of that on the $V_{pp}$ signal when the VOLTAGE REGULATOR INPUT CIRCUIT input, IN, is high. When the input, IN, is low, and the voltage on the $V_{pp}$ SIGNAL 302 is twelve volts the output signal, VPPW, has a voltage of approximately twelve volts.

Transistor 614 is a twenty-four volt rated n-channel MOSFET. Transistors 610 and 612 are each a twelve volt rated n-channel MOSFET. The remaining transistors illustrated in FIG. 9 are each twelve volt rated p-channel MOSFETs. The twenty-four volt rated p-channel MOSFETs 602, 604, 606 and 608, illustrated in FIG. 6 are replaced with voltage divider 902, voltage divider 904, and p-channel MOSFET 906. Voltage dividers 902, 904 are well known circuits. Voltage dividers 902, 904 each operate in a manner similar to voltage divider 702, described above. As such it is apparent that voltage divider 902 outputs a signal on node N25 having a voltage approximately equal to five-sixths of the voltage of $V_{pp}$ SIGNAL 302. Voltage divider 904 outputs a signal on node N40 having a voltage approximately equal to one-half the voltage on $V_{pp}$ SIGNAL 302.

As described above, the VOLTAGE REGULATOR INPUT CIRCUIT input, IN, is low only when the processor (not shown) requests that a portion of the EEPROM circuit be programmed. Therefore, when an EEPROM circuit 100 is to be erased, the input, IN, of the VOLTAGE REGULATOR INPUT CIRCUIT 318 is high. The VOLTAGE REGULATOR INPUT CIRCUIT 318 supplies a voltage equal to one-half of the voltage present on the $V_{pp}$ SIGNAL 302 when the VOLTAGE REGULATOR INPUT CIRCUIT input, IN, is high. That is, the voltage at the output node VPPZ is approximately twelve volts when the input, IN, is high and the voltage of the $V_{pp}$ SIGNAL is twenty-four volts. When the input, IN, is low the VOLTAGE REGULATOR INPUT CIRCUIT output VPPZ is approximately equal to $V_{pp}$, i.e., twelve volts.

Figure 9:
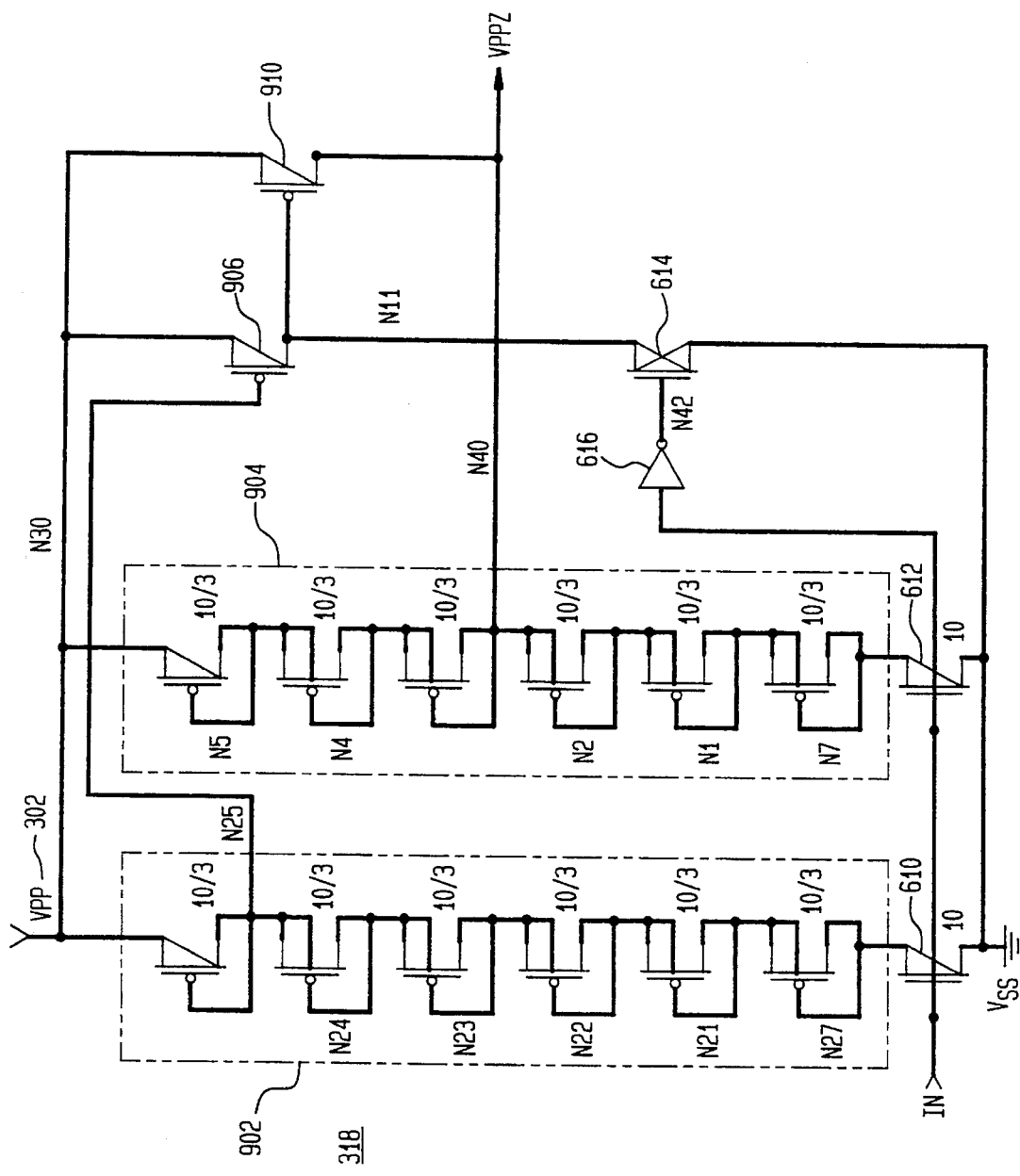
FIG. 9 is a schematic of the VOLTAGE REGULATOR INPUT CIRCUIT according to a preferred embodiment.

A unique aspect of the VOLTAGE REGULATOR INPUT CIRCUIT 318 as shown in FIG. 9 is that at no time will the voltage across any two terminals of a p-channel MOSFET be larger than twelve volts. Therefore, the highest rated p-channel MOSFET required to be in the VOLTAGE REGULATOR INPUT CIRCUIT 318 of the present invention is rated at twelve volts. How the VOLTAGE REGULATOR INPUT CIRCUIT 318 illustrated in FIG. 9 accomplishes the required functions without requiring a p-channel MOSFET rated above twelve volts is described below.

In the preferred embodiment, there is no concern that a p-channel MOSFET will have a voltage differential of greater than twelve volts when the $V_{pp}$ SIGNAL 302 is twelve volts or less. The only situation where a p-channel MOSFET rated above twelve volts could even potentially be required by the VOLTAGE REGULATOR INPUT CIRCUIT 318 is when the voltage on the $V_{pp}$ SIGNAL is greater than twelve volts. Therefore, the following analysis will focus on the situation which occurs when a twenty-four volt potential is applied to the VOLTAGE REGULATOR INPUT CIRCUIT 318.

When twenty-four volts are applied to the VOLTAGE REGULATOR INPUT CIRCUIT 318, the $V_{pp}$ SWITCH input IN must be high, i.e., the EEPROM IC 300 is not programming, because the processor (not shown) only applies twenty-four volts to the EEPROM IC 300 when requesting that a memory cell 102 be erased. When the $V_{pp}$ SIGNAL 302 voltage is approximately twenty-four volts and the input, IN, is high, voltage divider 902 outputs a voltage on node N25 of approximately 20 volts, i.e., (5$V_{pp}$/6), as discussed above. The signal at node N42 is low, therefore, transistor 614 does not conduct. The voltage on node N25, i.e., 20 volts, is applied to the gate of transistor 906 causing the transistor 906 to conduct. Since transistor 906 conducts the voltage on node N11 is approximately twenty-four volts. This voltage is applied to the gate of transistor 910. Since the voltage on the gate of transistor 910 is approximately equal to the voltage on its drain, transistor 910 does not conduct. The output voltage VPPZ is, therefore, equal to the output voltage of voltage divider 904 which is approximately twelve volts, i.e., ($V_{pp}/2$), as discussed above. As is seen from the above analysis, no p-channel MOSFET has a voltage greater than twelve volts across any of its terminals. As such, no p-channel MOSFET must be rated above twelve volts in the VOLTAGE REGULATOR INPUT CIRCUIT 318 of FIG. 9.

The presence of voltage dividers 902 and 904 and p-channel transistor 906 enable the VOLTAGE REGULATOR INPUT CIRCUIT 318 of FIG. 9 to receive a twenty-four volt signal without requiring a p-channel MOSFET rated above twelve volts.

Additional features pertaining to the operation of the VOLTAGE REGULATOR INPUT CIRCUIT 318 will be apparent to persons skilled in the relevant art based on FIG. 9, the above discussion, and general circuit theory.

Voltage Regulator

The VOLTAGE REGULATOR 324 of the present invention shall now be described with reference to FIG. 10. A conventional VOLTAGE REGULATOR 324 is described above with reference to FIG. 6B. The present invention outputs a signal V7 having a potential between seven and eight volts when the processor requests that an EEPROM circuit 100 be programmed. The output signal V7 is received by COLUMN PROGRAM CIRCUITS (not shown) within the EEPROM circuits 100. When programming, the COLUMN PROGRAM CIRCUITS (not shown) apply the output signal V7 to the drain of a memory cell 210 via a column line 108. As discussed above, the voltage on the V7 signal, i.e., between seven and eight volts, is necessary to ensure that the memory cell 102 is programmed properly.

Figure 6B:
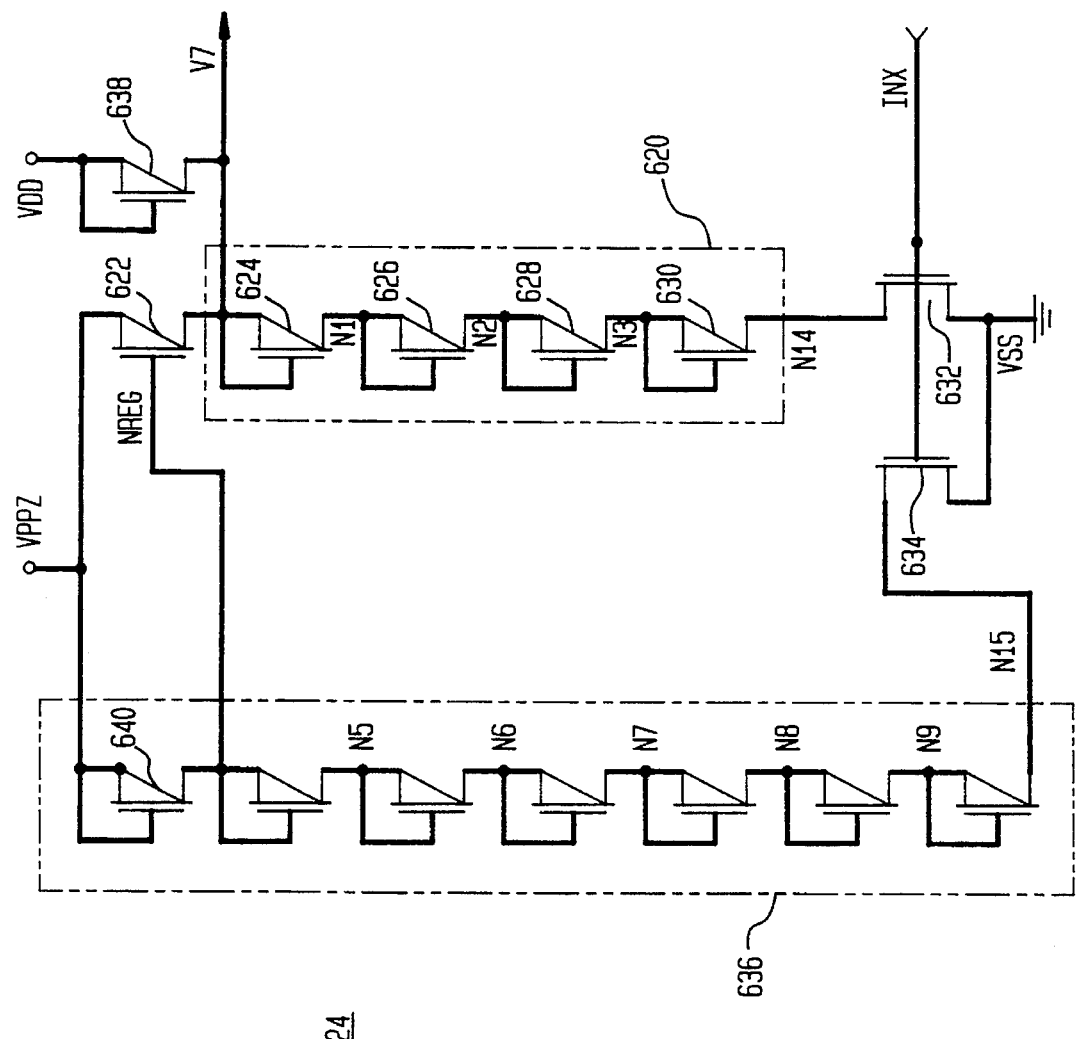
FIG. 6B is a schematic of a typical VOLTAGE REGULATOR.

As described above, transistors have an inherent threshold voltage. In an n-channel MOSFET, the MOSFET conducts only if a gate voltage is at least one threshold voltage $V_{TH}$ above the source voltage of the MOSFET. A MOSFET is designed such that its nominal threshold voltage is known. However, these threshold voltages can vary from their nominal values. Typically, the variance from the nominal threshold voltage will be consistent between transistors located within the same IC. The VOLTAGE REGULATOR 324, illustrated in FIG. 6B, is affected by these variances in a MOSFET's threshold voltage. A feature of the present invention is that the VOLTAGE REGULATOR 324 minimizes the output signal's (V7) dependence on MOSFET threshold voltage variances.

Figure 10:
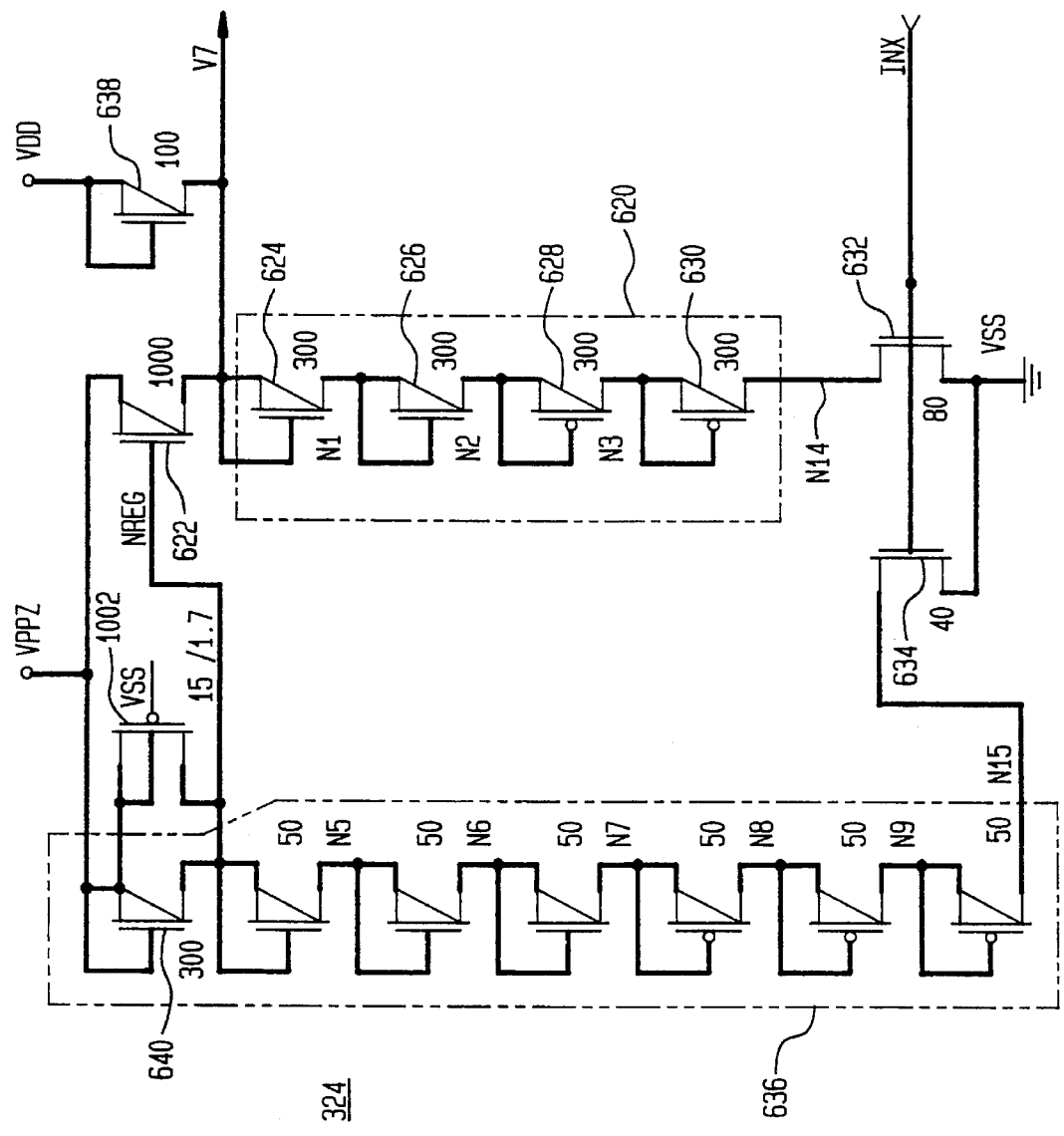
FIG. 10 is a schematic of the VOLTAGE REGULATOR according to a preferred embodiment.

FIG. 10 is a schematic of a VOLTAGE REGULATOR 324 according to a preferred embodiment of the present invention. As discussed above, the VOLTAGE REGULATOR 324 of the present invention outputs a signal, V7, which has a voltage between seven and eight volts when the VOLTAGE REGULATOR input, INX, is high. When the input, IN, is low, the output signal, V7, is unregulated.

Transistor 1002 is a weak, i.e., highly resistive, twelve volt rated p-channel MOSFET. Transistors 632 and 634 are five volt rated n-channel MOSFETs. The remaining transistors are twelve volt rated n-channel MOSFETs. Voltage dividers 620 and 636 are present in the IC and are well known circuits. Their function is described below.

As discussed above, the VOLTAGE REGULATOR input, INX, is high only when the processor (not shown) requests that a portion of the EEPROM circuit 100 is to be programmed. Therefore, when an EEPROM circuit 100 is to be read or erased, the input INX of the VOLTAGE REGULATOR 324 is low. When an EEPROM circuit 100 is being programmed the VOLTAGE REGULATOR INPUT CIRCUIT 318 supplies a twelve volt signal to the VOLTAGE REGULATOR 324 via signal VPPZ. As discussed above, the VOLTAGE REGULATOR 324 outputs a voltage between seven volts and eight volts on its output signal V7.

A unique aspect of the VOLTAGE REGULATOR 324, as shown in FIG. 10, is that its output voltage signal V7 is significantly more independent of variances in its transistor's threshold voltages than the VOLTAGE REGULATOR 324 illustrated in FIG. 6B. The VOLTAGE REGULATOR INPUT CIRCUIT 318 limits the input signal VPPZ voltage into the VOLTAGE REGULATOR 324 to twelve volts. Therefore, the voltage across any two terminals of a p-channel MOSFET located within the VOLTAGE REGULATOR 324 will not be larger than twelve volts. Consequently, the highest rated p-channel MOSFET required in the VOLTAGE REGULATOR INPUT CIRCUIT 318 of the present invention is rated at twelve volts.

As discussed above, the voltage of output signal V7 of VOLTAGE REGULATOR 324 is desired to be between seven volts and eight volts when the input, INX, is high. However, the output signal V7 of the VOLTAGE REGULATOR 324, as illustrated in FIG. 6B, is affected by threshold voltage variances of transistors 622 and 640. In the preferred embodiment of the present invention, the VOLTAGE REGULATOR 324, as illustrated in FIG. 10, outputs a signal V7 which does not significantly vary based upon the threshold voltage variation of transistor 640.

When the voltage on signal VPPZ is twelve volts and the input signal INX is high, transistors 632 and 634 conduct. As a result, voltage divider 636 is effectively coupled to ground. In the preferred embodiment, the nominal threshold of transistors 622 and 640 are approximately 2.5 volts. Without transistor 1002 the voltage at node NREG will be approximately 9.5 volts, i.e., ($V_{pp}-V_{TH}$). The voltage at node NREG is applied to the gate of transistor 622. Transistor 622 pulls its source node up to approximately seven volts, i.e., ($V_{NREG}-V_{TH}$). As discussed above, the actual threshold voltage can depart from the nominal threshold voltage. For example, the actual threshold voltage of transistors 622 and 640 can be three volts even though the nominal threshold voltage is 2.5 volts. In this situation the VOLTAGE REGULATOR 324, without transistor 1002, outputs a voltage of approximately six volts, i.e., ($V_{pp}-2V_{TH}$), on signal V7 which is outside an acceptable voltage output range, i.e., between seven volts and eight volts.

In the preferred embodiment of the present invention transistor 1002 is coupled in parallel with transistor 640. The gate of transistor 1002 is coupled to ground. Therefore, transistor 1002 always conducts. As discussed above, transistor 1002 has a high resistance across its channel. When the threshold voltage of transistors 622 and 640 are actually three volts, as opposed to the nominal value of 2.5 volts, the voltage at node NREG would be approximately nine volts, if transistor 1002 were not present. When transistor 1002 is present, the transistor 1002 attempts to pull the voltage at node NREG to twelve volts. However, the remaining transistors in voltage divider 636 prevent the voltage at node NREG from reaching twelve volts. Transistor 1002 and voltage divider 636 are designed such that the voltage at node NREG is approximately ten volts, i.e., approximately one threshold voltage above the acceptable voltage output range. The voltage at node NREG is applied to the gate of transistor 622 causing it to conduct. The voltage on output signal V7 will be approximately 7 volts, i.e., ($V_{NREG}-V_{TH}$). Therefore, the output voltage is within the acceptable output voltage range, i.e., between seven volts and eight volts.

The presence of transistor 1002 enables the VOLTAGE REGULATOR 324, as illustrated in FIG. 10, to output a voltage signal V7 within the acceptable output voltage range. The voltage on output signal V7 is within the acceptable output voltage range even when transistors 622 and 640 have threshold voltages that vary from their nominal threshold voltages.

Additional features pertaining to the operation of the VOLTAGE REGULATOR 324 will be apparent to persons skilled in the relevant art based on FIG. 10, the above discussion, and general circuit theory.

While the invention has been particularly shown and described with reference to a preferred embodiment and several alternate embodiments thereof, it will be understood by persons skilled in the relevant art that various change in form and details can be made therein without departing from the spirit and scope of the invention.

What is claimed is:

1. A high-voltage switch for receiving a first driver signal and a control signal, and for generating an output signal having a voltage not exceeding a predetermined voltage when the control signal voltage is approximately equal to a first value, and for generating the output signal having a voltage exceeding the predetermined voltage when the control signal voltage is approximately equal to a second value and the first driver signal exceeds the predetermined voltage, the high-voltage switch comprising:

a first p-channel MOSFET, rated no higher than the predetermined voltage, having a first drain, a first source, and a first gate, wherein said first source receives the first driver signal and said first gate receives a first signal;

a second p-channel MOSFET, rated no higher than the predetermined voltage, having a second source, a second drain, and a second gate, said second gate receiving a second signal;

a third p-channel MOSFET, rated no higher than the predetermined voltage, having a third drain, a third gate, and a third source, wherein said third source couples with said first drain, said third gate couples with a third signal, and said third drain couples with said second source;

a controllable shunt, having a fourth drain, a fourth gate, and a fourth source, wherein said fourth drain couples with said second drain, said fourth gate couples with the control signal, said fourth source couples with one of a second driver signal and ground, said controllable shunt coupling said second drain to said one of second driver signal and ground when the control signal voltage is approximately equal to the first value;

first means for generating said first signal and said third signal, wherein said first signal has a voltage between the first driver signal voltage and the predetermined voltage, wherein a voltage differential between said first gate and said first drain and a voltage differential between said first gate and said first source are less than the predetermined voltage, and wherein said third signal has a voltage between said first signal voltage and a voltage of said second signal, and wherein a voltage differential between said third gate and said third drain and a voltage differential between said third gate and said third source are less than the predetermined voltage;

second means for generating said second signal, wherein said second signal voltage does not exceed the predetermined voltage, and wherein a voltage differential between said second gate and said second drain and a voltage differential between said second gate and said second source are less than the predetermined voltage; and output means for generating the output signal, wherein said output means is coupled to the first driver signal, the control signal, and said second drain, wherein voltage differentials between said first drain and said first source, between said second drain and said second source, and between said third drain and said third source are less than the predetermined voltage.

2. The high-voltage switch of claim 1, wherein said first, second, and third transistors are each a metal-oxide semiconductor field effect transistor.

3. The high-voltage switch of claim 1, wherein the predetermined voltage is approximately twelve volts.

4. An apparatus within a computer system, for receiving a first driver signal and a control signal, and for generating an output signal having a voltage not exceeding a predetermined voltage, wherein the output signal is approximately equal to the first driver signal when the control signal voltage is approximately equal to a first value, and wherein the output signal is equal to a second driver signal, said second driver signal having a voltage less than the predetermined voltage, when the control signal voltage is approximately equal to a second value, the apparatus comprising:

first switch means, for coupling a first input to ground when said control signal voltage is approximately equal to the first value and for coupling said first input to the first driver signal when said control signal voltage is approximately equal to a second value;

second switch means, for coupling a second input to ground when said control signal voltage is approximately equal to said first value and for coupling said second input to a first signal when said control signal voltage is approximately equal to the second value, the voltage level of said first signal being approximately equal to the voltage level of a second signal;

bias means, for outputting said first signal and said second signal, said first signal and said second signal have a voltage level between zero volts and the sum of the predetermined voltage and a third signal voltage, when said control signal voltage is approximately equal to said second value;

a first p-channel MOSFET, rated no higher than said predetermined voltage, having a first drain, a first source and a first gate, wherein said first source receives the first driver signal, said first gate is coupled to the first input, said first drain coupled to said second signal, wherein said first MOSFET conducts only when the control signal voltage is approximately equal to the first value, whereby the second signal voltage is applied to said first drain when said first MOSFET does not conduct, wherein a voltage differential between any two of said first drain, said first gate, and said first source does not exceed the predetermined voltage because said second signal voltage maintains said second drain voltage at the predetermined voltage when said first driver signal voltage exceeds said predetermined voltage;

a second p-channel MOSFET, rated no higher than said predetermined voltage, having a second drain, a second gate, and a second source, wherein said second source is coupled to said first drain and said second signal, said second gate coupled to said second input, wherein a voltage differential between any two of said second drain, said second gate, and said second source does not exceed the predetermined voltage because said second signal voltage maintains said second source voltage at the predetermined voltage when said first driver signal voltage exceeds said predetermined voltage;

third switch means, coupled to said second drain and said second input, for coupling said second drain to the second driver signal when the voltage level of said control signal is approximately equal to said second value; and a third p-channel MOSFET, rated no higher than said predetermined voltage, having a third drain, a third gate, and a third source, wherein said third source is coupled to said second drain, said third gate coupled to said control signal, and said third drain is coupled to the second driver signal, for generating the output signal, wherein the first driver signal voltage exceeds the predetermined voltage only when the control signal voltage is approximately equal to the second value.

5. The apparatus of claim 4, wherein said first, and second transistors are each a metal-oxide semiconductor field effect transistor.

6. The apparatus of claim 4, wherein the predetermined voltage is approximately to twelve volts.

7. An apparatus for switching a driver signal in response to a first control signal, comprising:

first switch means, connected between ground and an output, for selectively connecting said output to ground in response to said first control signal;

second switch means, connected between said driver signal and said output for selectively connecting said driver signal to said output in response to a second control signal;

third switch means for receiving said driver signal and said first control signal and for generating said second control signal, said third switch means including a plurality of MOSFETS, said driver signal being distributed across said plurality of MOSFETS so that said driver signal is not across any single MOSFET;

first voltage divider means for dividing said driver signal into a plurality of lower voltage signals for biasing said third switch means; and second voltage divider means for controlling said third switch means.

8. The apparatus of claim 7, wherein said first switch means comprises an n-channel MOSFET.

9. The apparatus of claim 8, wherein said second switch means comprises an n-channel MOSFET.

10. The apparatus of claim 9, wherein said third switch means comprises:

a first p-channel MOSFET, having a first drain, a first gate, and a first source, wherein said first source receives said driver signal;

a second p-channel MOSFET, having a second drain, a second gate, and a second source;

a third p-channel MOSFET, having an third drain, a third gate, and a third source, wherein said third source couples with said first drain, and said third drain couples with said second source; and a fourth n-channel MOSFET, having a fourth drain, a fourth gate, and a fourth source, wherein said fourth drain couples with said second drain, said second drain generating said second control signal, said fourth gate receives said first control signal, and said fourth source connects to ground.

* * * * *